United States Patent [19]

Kohsaka

[11] Patent Number: 5,321,643
[45] Date of Patent: Jun. 14, 1994

[54] DIGITAL COMB FILTER

[75] Inventor: Yoshiaki Kohsaka, Saitama, Japan

[73] Assignee: Kabushiki Kaisha Toshiba, Kanagawa, Japan

[21] Appl. No.: 704,952

[22] Filed: May 23, 1991

[30] Foreign Application Priority Data

Jun. 22, 1990 [JP] Japan .................................. 2-162715

[51] Int. Cl.⁵ .............................................. G06F 15/31
[52] U.S. Cl. .............................. 364/724.17; 364/574; 364/724.07
[58] Field of Search ............... 364/572, 142, 143, 574, 364/724.07, 724.06, 724.08, 724.17

[56] References Cited

FOREIGN PATENT DOCUMENTS 378642 10/1985 Austria .
0249465 12/1987 European Pat. Off. .
0326255 1/1989 European Pat. Off. .
3544865 12/1985 Fed. Rep. of Germany .
3920164 6/1989 Fed. Rep. of Germany .

OTHER PUBLICATIONS

"New Software Servo System with a Single-Chip Microprocessor for VCRs", by Tomitaka et al., IEEE Transactions on Consumer Electronics, Aug. 1988, vol. 34, No. 3, pp. 571-579.

Primary Examiner—Jack B. Harvey
Assistant Examiner—Edward J. Pipala
Attorney, Agent, or Firm—Banner, Birch, McKie and Beckett

[57] ABSTRACT

A digital comb filter includes a period measurement circuit, a subtracter, a first adder, a first memory and a first multiplier. The period measurement circuit outputs difference signals representing differences between periods of target and input pulses. The subtracter subtracts a first deviation signal of the first multiplier from the difference signal of the period measurement circuit. The first adder adds a first accumulation signal of the first memory to the output of the subtracter. The first memory latches the output of the first adder, and the first multiplier multiplies the first accumulation signal by a first coefficient. The digital comb filter also includes a second adder, a second memory, a second multiplier and a third adder. The second adder adds a second accumulation signal of the second memory to the output of the first adder. The second memory latches the output of the second adder. The second multiplier multiplies the second accumulation signal from the second memory by a second coefficient. The third adder adds the output from the subtracter to a second deviation signal from the second multiplier.

19 Claims, 5 Drawing Sheets

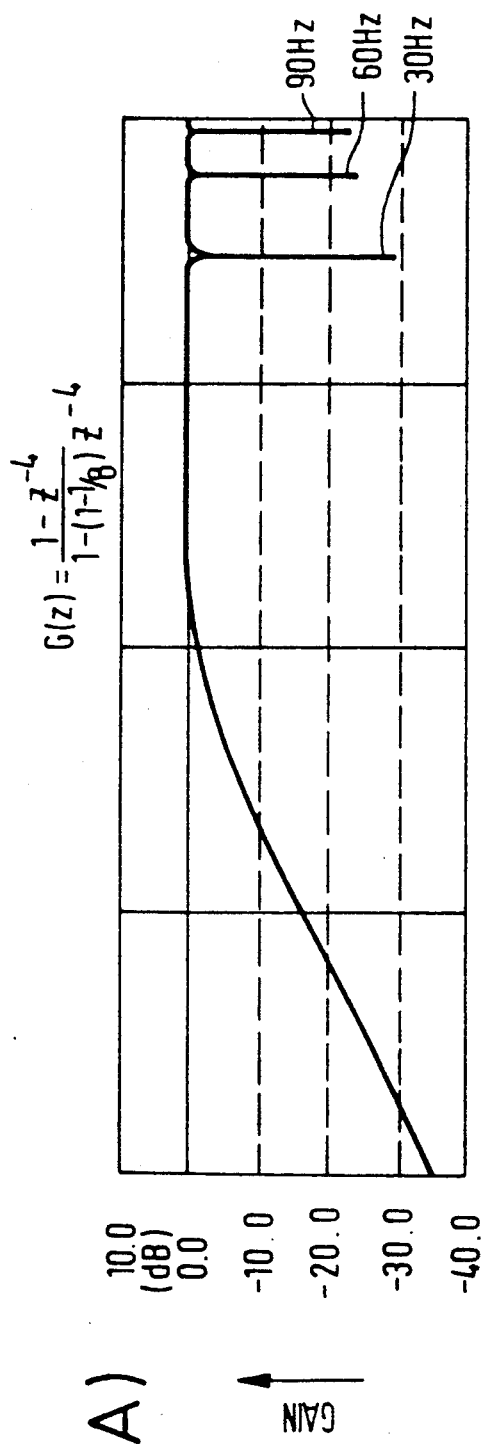
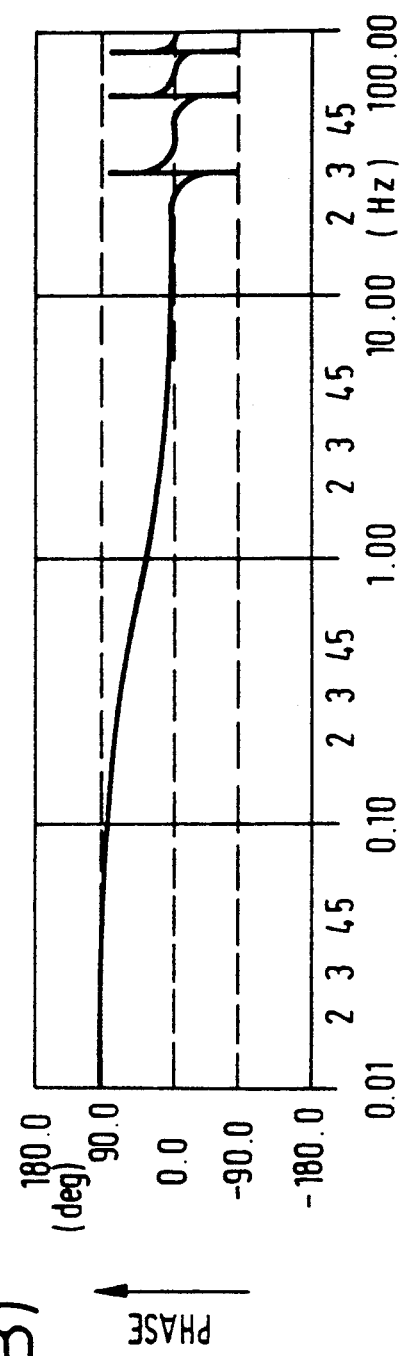
FIG. 2(A) (PRIOR ART)
FIG. 2(B) (PRIOR ART)

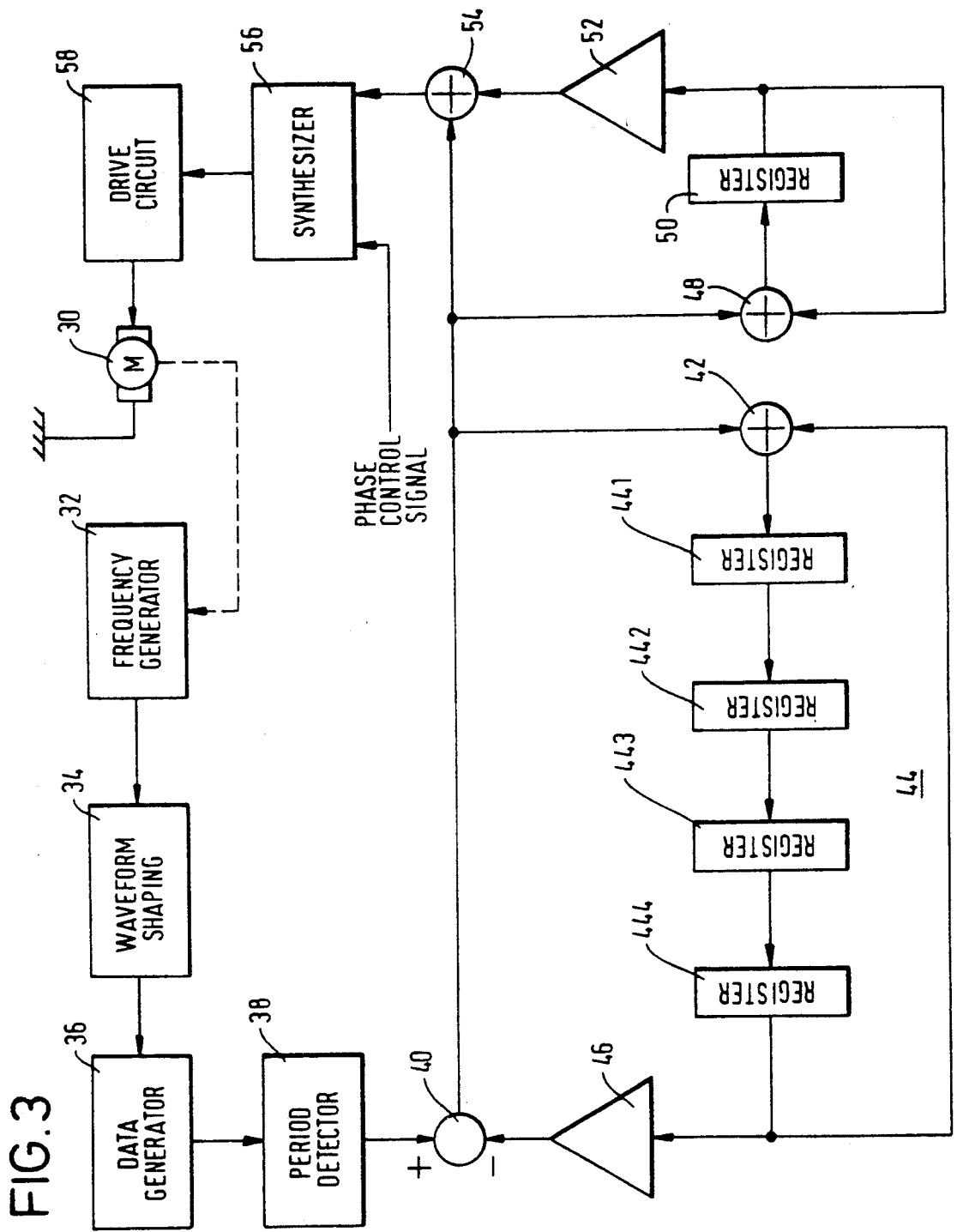

DIGITAL COMB FILTER

BACKGROUND OF THE INVENTION

1. Field of the Invention

The present invention relates to digital comb filters and more particularly, to a digital comb filter for use in a video cassette recorder for controlling the rotation speed and phase of rotating magnetic heads.

2. Description of the Related Art

A drum servo apparatus is installed in a home video cassette recorder (VCR) to control the rotation speed and rotation phase of a rotary disc on which magnetic heads are mounted. The disc is driven by a drum motor. A frequency generator (FG), which generates a signal (FG signal) having a frequency proportional to the rotation speed of the drum motor, and a pulse generator (PG), which generates a pulse signal (PG signal) when the rotation of the disc reaches a predetermined phase, are fixed to the drum motor. The rotation speed and phase of the disc are controlled by regulating the drive current of the drum motor responsive to the FG signal and PG signal. Specifically, control of the rotation speed of the disc is implemented by controlling the rotation speed of the drum motor so that the period of the FG signal corresponds to a predetermined target value. Control of the rotation phase of the disc is implemented by controlling the rotation phase of the drum motor so that the phase of the PG signal has a predetermined relationship with a reference signal.

Unfortunately, however, the amplitude and phase of the FG signal does not remain constant even if the rotation speed of the drum motor remains constant. It is because of the effects of fixing error, eccentricity of the rotation axis or the electromagnetic field of the motor, etc., that parts of the FG are fixed around the rotation axis of the drum motor. This state is called FG unevenness. FG unevenness causes a phenomenon whereby the frequency of the FG signal is not constant even when the rotation of the drum motor is constant, and therefore the rotation of the drum motor is varied conversely.

As a method of solving this problem, a method of removing the component of an integer times the number of rotations of the drum motor was reported in "Television Gakkai Technical Report", Vol. 12, No. 17. FIG. 1 is a block diagram of a digital comb filter according to the above report. Referring to this figure, drum motor 10 has an associated frequency generator (FG) 12 which generates a pulse signal (FG signal) having a frequency proportional to the rotation speed of drum motor 10. According to a disclosed embodiment, FG 12 outputs four pulse signals during each rotation of drum motor 10.

Pulse detector 14 is connected to the output of FG 12, for shaping the waveform of the FG signal. Period measurement circuit 16 is connected to the output of pulse detector 14 for generating a difference signal which represents the difference between the periods of a target signal and input pulses.

Subtracter 18 is connected to the output of period measurement circuit 16. Subtracter 18 subtracts the deviational signal which will be described later, from the difference signal generated by period measurement circuit 16. Both adder 20 and drum motor 10 are connected to the output terminal of subtracter 18. Adder 20 adds an accumulation signal, which will be described later, to the output signal of subtracter 18. Accumulation circuit 22 having four registers, 221 through 224, connected in series, is connected to the output of adder 20. Accumulation circuit 22 stores the four differences between each target period and each input FG pulse period to four registers 221 through 224, respectively.

Coefficient circuit 24 is connected to the output of accumulation circuit 22. Coefficient circuit 24 multiplies the output from accumulation circuit 22 by a coefficient K where K is in the following range: $0<K<1$. The other input terminal of adder 20 is connected to the output of register 224 of accumulation circuit 22. The other input terminal of subtracter 18 is connected to the output of coefficient circuit 24.

The operation of the above digital comb filter will now be described below.

An FG signal is generated from FG 12 by the rotation of drum motor 10. The output waveform of the FG signal is shaped by pulse detector 14. In period measurement circuit 16, the difference signal representing the differences between the periods of a target signal and the output from pulse detector 14 is generated. The output signal of coefficient circuit 24, described in more detail below, is subtracted from the difference signal by subtracter 18.

The output of subtracter 18 is added to the output of register 224 of accumulation circuit 22 by adder 20. The output of adder 20 is first stored in register 221 of accumulation circuit 22. When the next output from adder 20 is generated, the output stored in register 221 is transferred to register 222, and the new output of adder 20 is stored in register 221. Each time a new output of adder 20 is stored in register 221, the output currently stored in registers 221 through 223 is transferred sequentially to the next register. The output of register 224 is transferred back to adder 20 and to coefficient circuit 24. Through this process, the four most recent outputs from adder 20 will be stored in registers 221 through 224. In this case, because four FG signals are generated by a rotation of drum motor 10, a group of four difference signals corresponding to a rotation of drum motor 10 are accumulated in accumulation circuit 22. Thus, in subtracter 18, the last group of four difference signals, which are accumulated in accumulation circuit 22, are sequentially multiplied by K of coefficient circuit 24 and subtracted from the four difference signals corresponding to the next rotation.

For example, if the period of the FG signal measured first in period measurement circuit 16 is different from the target period, a difference signal is obtained from period measurement circuit 16. If the contents of register 224 is zero, the difference signal from period measurement circuit 16 is output to drum motor 10 and adder 20 without a change of value from subtracter 18. In this case, unevenness of the FG signal is not removed. However, in the next rotation period of drum motor 10, the above difference signal will have been transferred to register 224 through adder 20 and registers 221 through 223. Thus, in subtracter 18, the difference signal from period measurement circuit 16 corresponding to the first FG signal in the next rotation of drum motor 10 is subtracted from the difference signal stored in register 224 multiplied by coefficient K. The value from subtracter 18 is thereby reduced and in every period thereafter, difference signals are reduced. Finally, the difference signal reaches zero, and the unevenness of the FG signal generated is removed by the above circuit. Such output from subtracter 18 is supplied to drum motor 10.

The unevenness of the rotation caused by noise, etc., results in the difference signal removing such noise at the output of subtracter 18. Thus, the signal for reducing the unevenness is supplied to motor 10.

The unevenness of the rotation caused by noise, etc., results in the difference signal removing such noise at the output of subtractor 18. Thus, the signal for reducing unevenness is supplied to motor 10.

In the above digital comb filter, if coefficient K of coefficient circuit 24 is adequately small, the reduction of the gain characteristic in the low frequency band may be small. However, in the initial state, such as when the rotation of drum motor 10 begins, the time needed to reduce unevenness of the FG signal is long.

A large coefficient K in coefficient circuit 24 may be used to decrease response time. However, if large coefficient K is adopted, the noise compensating gain characteristic of the low frequency band, (that is, near direct current) is reduced. FIG. 2 illustrates a characteristic of the digital comb filter shown in FIG. 1, and shows this problem.

SUMMARY OF THE INVENTION

Accordingly, it is an object of the present invention to provide an improved digital comb filter which has a rapid response characteristic without a reduction of the gain characteristic in the low frequency band.

In accordance with the present invention, the foregoing object is achieved by providing a digital comb filter comprising a period measurement means for outputting difference signals representing differences between periods of targets and input pulses, a subtracter for subtracting a first deviation signal from the difference signal of the period measurement means, a first adder for adding a first accumulation signal to the output of the subtracter, a first memory for outputting the first accumulation signal by latching the output of the first adder, a first multiplier for multiplying the first accumulation signal by a first coefficient to obtain the first deviation signal, a second adder for adding a second accumulation signal to the output of the subtracter, a second memory for outputting the second accumulation signal by latching the output of the second adder, a second multiplier for multiplying the second accumulation signal from the second memory by a second coefficient to obtain a second deviation signal, and a third adder for adding the output of the subtracter to the second deviation signal of the second multiplier.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which:

FIGS. 2(A) and 2(B) illustrate the characteristics of the digital comb filter shown in FIG. 1.

FIG. 3 provides a block diagram of a digital comb filter according to the present invention.

DETAILED DESCRIPTION OF THE PREFERRED EMBODIMENT

Figure 1:
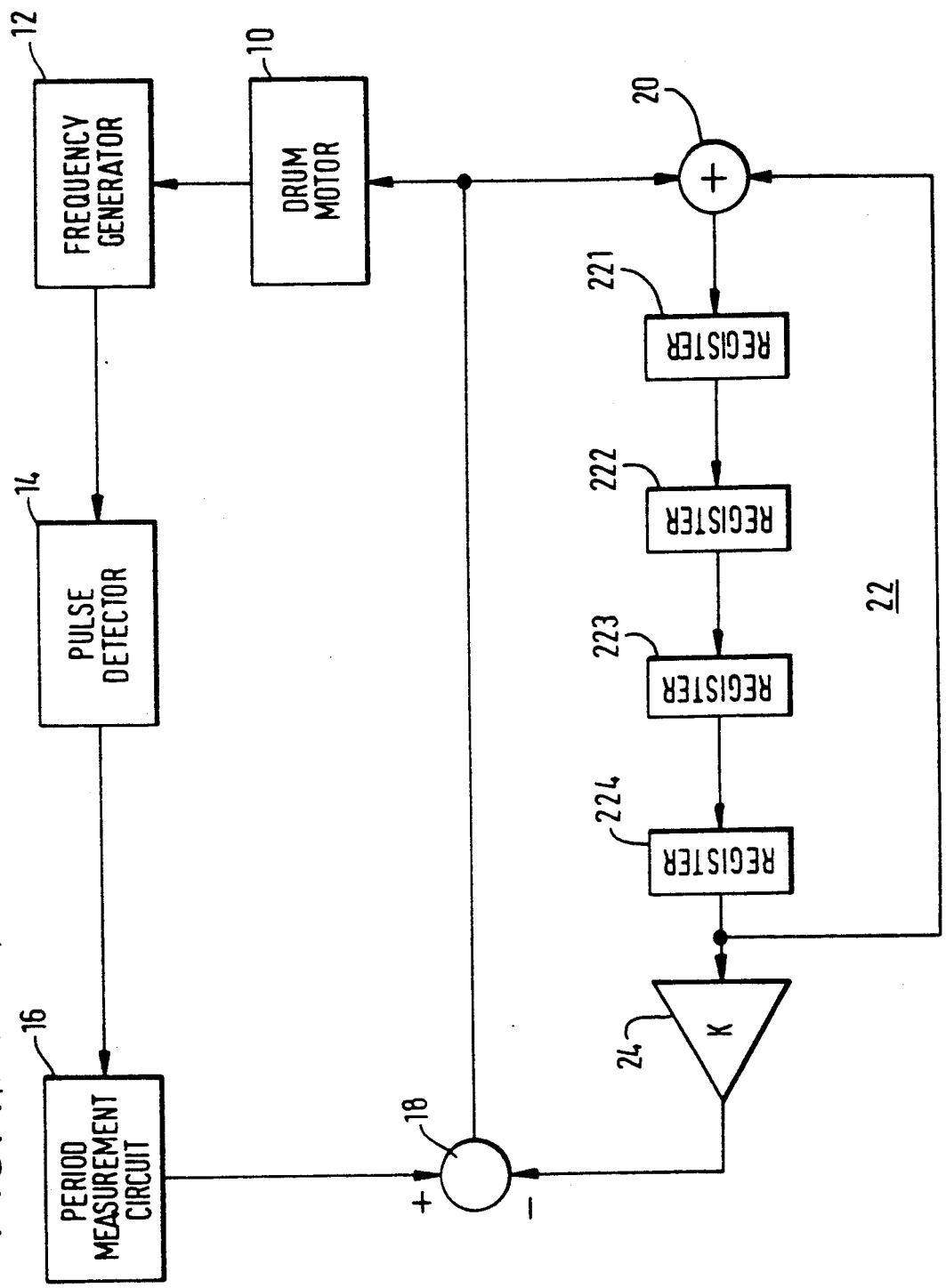
FIG. 1 provides a block diagram of a digital comb filter of the prior art.

The preferred embodiment of the present invention will now be described in more detail with reference to the accompanying drawings. Where, in the drawings, the same numerals are applied to similar elements, the detailed descriptions thereof are not repeated.

FIG. 3 is a block diagram of a digital comb filter according to the present invention. Drum motor 30 in a video cassette recorder, hereinafter referred to as a VCR, is attached to a frequency generator (FG) 32. The rotation speed of motor 30 is detected by FG 32. In this embodiment, four FG pulses are generated per rotation of drum motor 30 from FG 32. Waveform shaping circuit 34 is connected to the output of FG 32 for shaping the waveform of the input signal.

Period data generator 36 is connected to the output of waveform shaping circuit 34, for generating digital data having a value corresponding to the period of the FG signal. Period detector 38 is connected to the output of period data generator 36. Period detector 38 detects whether the period of FG pulses input thereto is equal to a predetermined target value, and outputs a difference signal which represents the difference between target value and input data.

Subtracter 40 is connected to the output of period detector 38. Subtracter 40 subtracts a deviation signal, which will be described later, from the difference signal of period detector 38. Adder 42 is connected to the output of subtracter 40. Adder 42 adds an accumulation signal, which will be described later, to the output signal of subtracter 40. Accumulation circuit 44 is connected to adder 42, and has four registers 441, 442, 443 and 444 connected in series. Accumulation circuit 44 sequentially stores the differences between each target and each FG signal period data corresponding to each FG pulse. Coefficient circuit 46 is connected to the output of accumulation circuit 44. Coefficient circuit 46 multiplies the output from accumulation circuit 44 (e.g., the accumulation signal) by coefficient K, where K is in the following range: (0<K<1). The other input terminal of adder 42 is also connected to the output of accumulation circuit 44 (e.g., register 444). The input terminal of subtracter 40 is connected to the output of coefficient circuit 46.

Adder 48 is connected to the output of subtracter 40. Adder 48 adds an accumulation signal from register 50 (described below) to the output of subtracter 40. Register 50 is connected to the output of adder 48. Register 50 latches the output signal from adder 48. Coefficient circuit 52 is connected to the output of register 50. Coefficient circuit 52 multiplies the output of register 50 by L, where L has the following relationship to K: (L=K/4). Adder 54 is connected to the output of subtracter 40 and the output of coefficient circuit 52, for adding the output of coefficient circuit 52 to that of subtracter 40.

Synthesizer 56 is connected to the output of adder 54 and phase controller (not shown). Synthesizer 56 synthesizes the output signal of phase controller (this is a phase error signal for phase control) and the output of adder 54, and converts the output to an analog signal. Drive circuit 58 is connected to the output of synthesizer 56 for converting the input signal to a signal for driving drum motor 30. Drum motor 30 is driven by drive circuit 58. The operation of the above filter is described below.

FG pulses are generated from FG 32 by the rotation of drum motor 30. The waveform of FG pulses are shaped by waveform shaping circuit 34. The waveform shaped signal from waveform shaping circuit 34 is converted to digital data by period data generator 36 according to the period of the FG pulses. In period detector 38, the difference signal (which represents the difference between a predetermined target period and output from waveform shaping circuit 34) is output as digital data. Digital data from period data generator 36 is input to subtracter 40.

The output signal of coefficient circuit 46 (described below) is subtracted from the difference signal from period detector 38 in subtracter 40. The output of subtracter 40 is added to the output of accumulation circuit 44 by adder 42. The output of adder 42 is latched by register 441. The output from register 441, which stores the output of adder 42, is transferred to register 442 every time a difference signal is output from adder 42. Likewise, the output of register 442 is transferred to register 443 and the output of register 443 is transferred to register 444. Timing of these transfers are synchronized with the period of the FG signal. In this embodiment, four FG pulses are generated by a rotation of drum motor 30. That is, four difference signals corresponding to a rotation of drum motor 10 are stored in the four registers of accumulation circuit 44 because there are the same number of registers as the number of FG pulses generated per rotation of the drum motor.

The output of register 444 is input to coefficient circuit 46, and multiplied by coefficient K. The output of coefficient circuit 46 is input to subtracter 40 as a deviational signal, and subtracted from the first difference signal obtained from the next rotation of drum motor 10.

The output of register 444 is also input to adder 42, and added to the output signal from subtracter 40 corresponding to the first FG pulse of the next rotation of drum motor 10.

Offset components are accumulated successively in each register 441 through 444. The offset components accumulated in registers 441 through 444 are subtracted from the output of period detector 38 by subtracter 40. Thus, the output signal from subtracter 40 is adjusted to have no offset in each period.

The output signal from subtracter 40 is input to adders 48 and 54. In adder 48, accumulated components from register 50 (described below) are added to the output from subtracter 40. The output of adder 48 is then input to register 50. A first offset component derived from the unevenness of FG signal is basically removed from the output of subtracter 40. That is, the output of subtracter 40 includes a second offset component derived from the unevenness of rotation caused by noise, especially noise in the low frequency band (that is, nearly direct current noise) except above first offset component. These second offset components are accumulated in register 50.

The output of register 50 is input to coefficient circuit 52, and multiplied by L, where L has the following relationship to K: (L=K/4), to become the deviation signal. The output from coefficient circuit 52 is supplied to adder 54. The output from subtracter 40 is added to the output from coefficient circuit 52 by adder 54. By this adding process, direct current components in the input signal are maintained. If a direct current gain of the total system in this embodiment is equal to 1, the time constants of the first comb filter (utilizing accumulation circuit 44) and the second comb filter (utilizing accumulation circuit 50) need to be coincident. Coefficient L in coefficient circuit 52 of the second comb filter needs to be set to K/m to satisfy the above condition, where the coefficient K of coefficient circuit 46 is in the range: (0<K<1), and the number of registers in accumulation circuit 44 is m. In this case, transfer function G(Z) of the comb filter in the embodiment is as follows:

$$G(Z) = \frac{1 - Z^{-4}}{1 - (1 - K)Z^{-4}} \cdot \left(1 + L\frac{Z^{-1}}{1 - Z^{-1}}\right) \tag{1}$$

The output of adder 54 is input to synthesizer 56, and synthesized with output phase error signal of a phase controller (not shown) which is connected to another input terminal of synthesizer 56. The output synthesized is converted to a digital signal and output to drive circuit 58. The output of synthesizer 56 is amplified adequately by drive circuit 58 so as to drive motor 30. Motor 30 is rotated by the output of drive circuit 58.

Figure 4A:
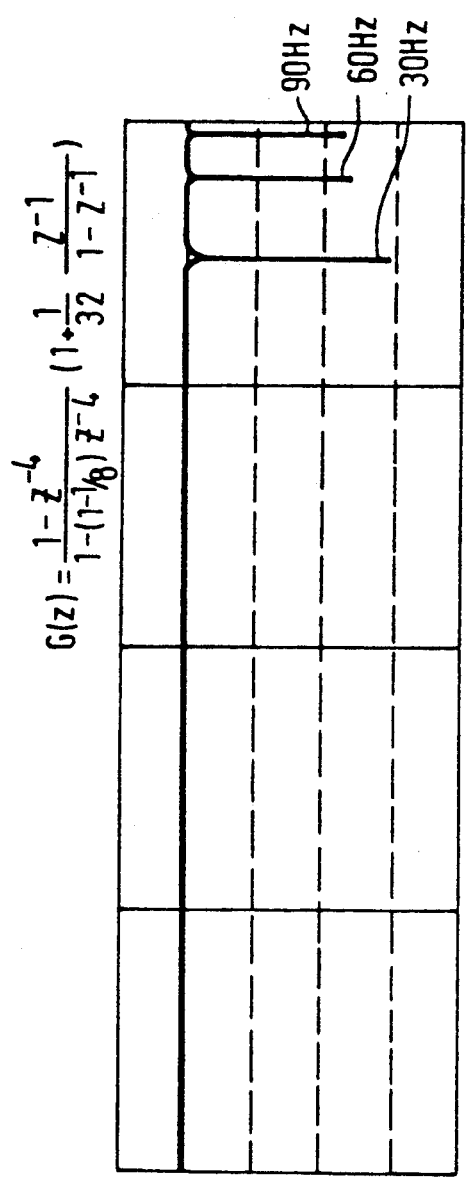
FIGS. 4(A) and 4(B) illustrate the characteristics of the digital comb filter shown in FIG. 3.
Figure 4B:
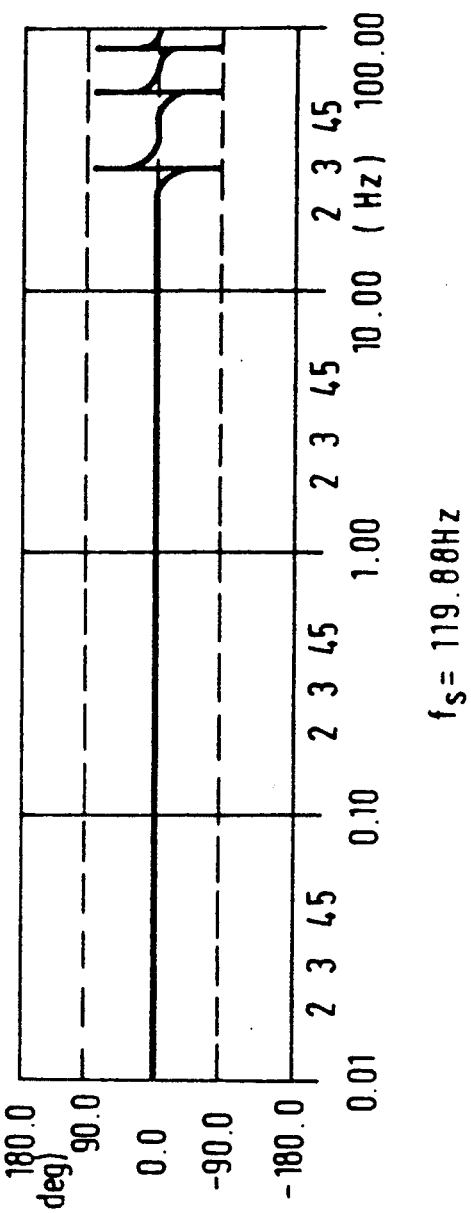

As shown in FIG. 4, direct current gain in the low frequency band in this embodiment remains more constant than that of the prior art as shown in FIG. 2. That is, both the gain frequency characteristic (FIG. 4(A)) and the phase-frequency characteristic (FIG. 4(B)) of the present invention show better results than those of the prior art (FIGS. 2(A) and 2(B)).

According to one embodiment, even if noise which mainly has a direct current component is input to the above control system, the noise is suppressed, and direct current offset is not occurred. By compensation of the direct current gain, the integral coefficient in the former filter may approach 1. This means that the speed of removing the unevenness of the FG signal may be further increased.

Figure 5:
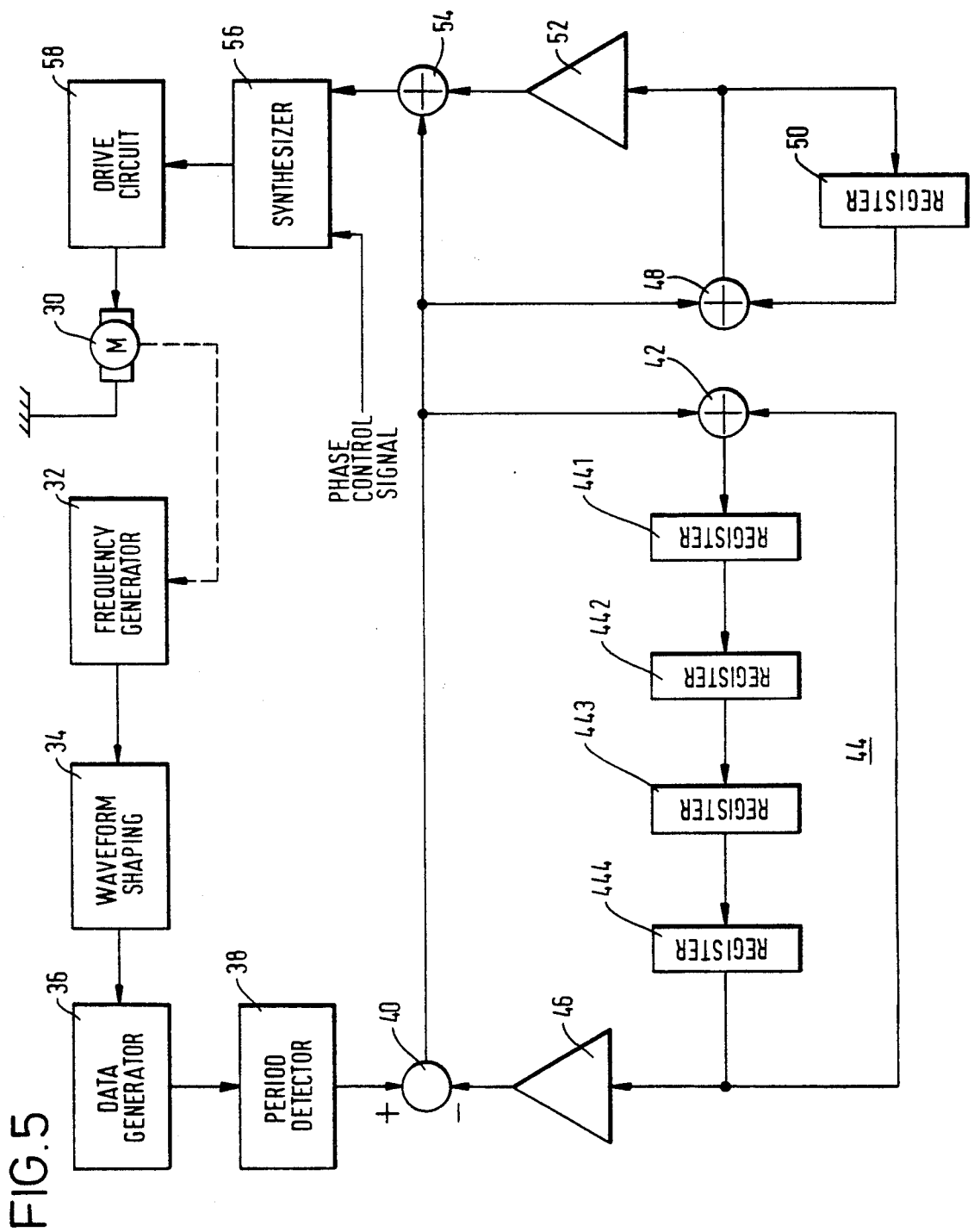
FIG. 5 provides a block diagram of a digital comb filter of the second embodiment according to the present invention.

FIG. 5 is a block diagram of a digital comb filter of a second embodiment according to the present invention.

The difference between the first and second embodiments is only the connection state of register 50. Specifically, in the second embodiment, register 50 is positioned in the feedback loop between one of the input terminals of adder 48 and the input terminal of coefficient circuit 52 which is connected to the output of adder 48. The effect obtained from the second embodiment is the same as that of the first embodiment, except that in this second embodiment, transfer function G(Z)' of the comb filter is as follows:

$$G(Z)' = \frac{1 - Z^{-4}}{1 - (1 - K)Z^{-4}} \cdot \left(1 + L\frac{1}{1 - Z^{-1}}\right) \tag{2}$$

In the above embodiments, the invention is adapted for use in the control system of a drum motor in a VCR. However, the invention is not limited to this embodiment. The invention may be adapted to many kinds of rotation control systems.

What is claimed is:

1. A digital comb filter comprising:
    a period measurement means for outputting difference signals representing differences between periods of target and input pulses;
    a subtracter connected to said period measurement means for subtracting a first deviation signal from the difference signal of the period measurement means;
    a first adder connected to said subtracter for adding a first accumulation signal to the output of the subtracter;
    a first memory connected to said first adder for storing the first accumulation signal by latching the output of the first adder;
    a first multiplier connected to said first memory for multiplying the first accumulation signal by a first coefficient to obtain the first deviation signal;
    a second adder connected to said subtracter for adding a second accumulation signal to the output of the subtracter;
    a second memory connected to said second adder for storing the second accumulation signal by latching the output of the second adder;
    a second multiplier for multiplying the second accumulation signal from the second memory by a second coefficient to obtain a second deviation signal; and
    a third adder connected to said second multiplier for adding the output of the subtracter to the second deviation signal of the second multiplier.

2. A digital comb filter as claimed in claim 1, wherein the input pulses to the period measurement means have frequency according to the rotation speed of a rotating object.

3. A digital comb filter as claimed in claim 2, wherein the input pulses to the period measurement means are generated from a frequency generator fixed to the rotating object.

4. A digital comb filter as claimed in claim 2, wherein the output of the third adder is supplied to a drive means for driving the rotating object to control the rotation of the rotating object.

5. A digital comb filter as claimed in claim 2, wherein the rotation object is a motor.

6. A digital comb filter as claimed in claim 2, wherein the first memory includes a plurality of registers connected in series.

7. A digital comb filter as claimed in claim 6, wherein the number of the registers corresponds to the number of pulses generated per rotation of the rotating object.

8. A digital comb filter as claimed in claim 6, wherein the timing of transferring signals in the registers corresponds to the period of input pulses.

9. A digital comb filter as claimed in claim 6, wherein the first coefficient K is in the range ($0<K<1$), and the second coefficient L is related to K ($L=K/m$), where m is the number of the registers.

10. A digital comb filter as claimed in claim 1, wherein the input to said second multiplier is the output from said second memory and wherein the input to said second memory is the output from said second adder.

11. A digital comb filter as claimed in claim 1, wherein the input to said second memory and the input of said second multiplier is the output from said second adder.

12. A digital comb filter as claimed in claim 11, wherein the input pulses to the period measurement means have a frequency according to the rotation speed of a rotating object.

13. A digital comb filter as claimed in claim 12, wherein the input pulses to the period measurement means are generated from a frequency generator fixed to the rotating object.

14. A digital comb filter as claimed in claim 12, wherein the output of the third adder is supplied to a drive means for driving the rotating object to control the rotation of the rotating object.

15. A digital comb filter as claimed in claim 12, wherein the rotating object is a motor.

16. A digital comb filter as claimed in claim 12, wherein the first memory includes a plurality of registers connected in series.

17. A digital comb filter as claimed in claim 16, wherein the number of the registers corresponds to the number of pulses generated per rotation of the rotating object.

18. A digital comb filter as claimed in claim 16, wherein the timing of transferring signal in the registers corresponds to the period of input pulses.

19. A digital comb filter as claimed in claim 16, wherein the first coefficient K is in the range ($0<K<1$), and the second coefficient L is related to K ($L=K/m$), where m is the number of the registers.

* * * * *